United States Patent [19]
Hush et al.

[11] Patent Number: 5,818,365
[45] Date of Patent: Oct. 6, 1998

[54] SERIAL TO PARALLEL CONVERSION WITH PHASE LOCKED LOOP

[75] Inventors: Glen Hush, Boise; Jake Baker, Meridian; Tom Voshell, Boise, all of Id.

[73] Assignee: Micron Display Technology, Inc., Boise, Id.

[21] Appl. No.: 723,059

[22] Filed: Oct. 1, 1996

Related U.S. Application Data

[63] Continuation of Ser. No. 372,412, Jan. 13, 1995, Pat. No. 5,598,156.

[51] Int. Cl.$^6$ ................................................... H03M 9/00
[52] U.S. Cl. ............................................. 341/100; 375/376
[58] Field of Search ................................... 341/100, 101; 375/376; 377/73, 74

[56] References Cited

U.S. PATENT DOCUMENTS

| | | | |
|---|---|---|---|
| Re. 32,326 | 1/1987 | Nagel et al. | 358/83 |
| 4,843,471 | 6/1989 | Yazawa et al. | 358/160 |
| 4,901,076 | 2/1990 | Askin et al. | 341/100 |
| 5,021,873 | 6/1991 | Abumi | 358/21 R |
| 5,093,732 | 3/1992 | Yoshinaka | 358/339 |
| 5,107,264 | 4/1992 | Novof | 341/101 |
| 5,208,678 | 5/1993 | Nakagawa | 358/341 |
| 5,485,484 | 1/1996 | Williams et al. | 375/376 |
| 5,577,086 | 11/1996 | Fujimoto et al. | 375/376 |

OTHER PUBLICATIONS

"The NTSC Color Television Standards," Proceedings of the I.R.E., Jan. 1954, pp. 46–48.
"NTSC Signal Specifications," Proceedings of the I.R.E., Jan. 1954, pp. 17–19.

*Primary Examiner*—Marc S. Hoff
*Attorney, Agent, or Firm*—William R. Bachand; Robert J. Stern

[57] ABSTRACT

A serial to parallel conversion circuit uses a dynamic shift register in a phase locked loop for an index to access a parallel holding register. The composite input signal includes serial data to be sampled and a synchronizing signal at an integer factor of the sampling serial data rate. The phase locked loop generates a control signal for sampling the serial data at a multiple of the synchronizing frequency by incorporating a delay between a variable frequency oscillator output and a phase comparator input. The delay element in one embodiment includes a shift register with a walking-one pattern that overflows to the phase comparator. The walking-one pattern is used to identify which position of the holding register should store the next sample of the input signal. The shift register is self-initialized by a logic combination of all shift register outputs. Power dissipation by the serial to parallel conversion circuit is minimal because only one 7-transistor shift register cell draws current at a time.

35 Claims, 5 Drawing Sheets

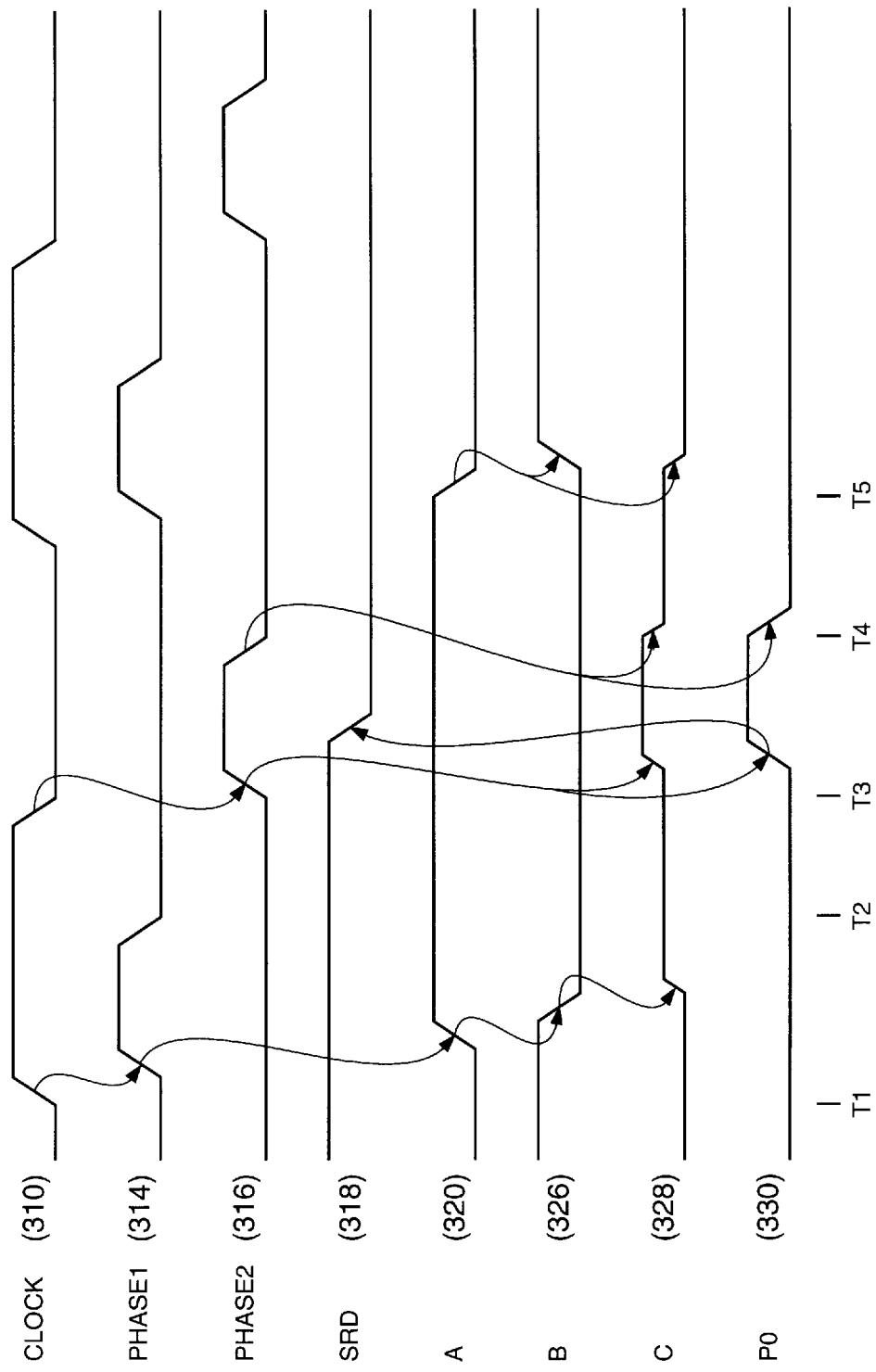

SERIAL TO PARALLEL CONVERSION WITH PHASE LOCKED LOOP

This application is a continuation of application Ser. No. 08/372,412 filed Jan. 13, 1995, now U.S. Pat. No. 5,598,156.

This invention was made with Government support under Contract No. DABT63-93-C-0025 awarded by Advanced Research Projects Agency (ARPA). The Government has certain rights in this invention.

FIELD OF THE INVENTION

This invention relates to serial to parallel conversion circuits and to systems for sampling composite signals.

BACKGROUND OF THE INVENTION

As an introduction to the problems solved by the present invention, consider a composite signal 10 containing both amplitude modulated information during a first period 12 and a synchronization signal, sometimes called a "sync" signal during a second period 13 as shown generally in FIG. 1. Such signals are useful in instrumentation telemetry and communications systems, to name a few technologies, where a processor of analog information must be synchronized with the source of analog signals.

At the processor, sync signal 16 is separated from composite signal 10 to facilitate clock recovery. Conventional clock recovery circuits include a phase locked loop having a binary counter as a delay element. The carry signal, provided when the maximum count (N) of the counter is exceeded, is connected to a phase comparator of the loop along with the sync signal. The error signal resulting from phase comparison and low-pass filtering will keep a variable frequency oscillator (VFO) of the loop locked at a frequency N times the sync frequency. The clock recovered by the phase locked loop is then used to control sampling of the amplitude modulated portion of composite signal 10.

Serial to parallel conversion of a number of samples is conventionally accomplished by separately addressing a memory device for each sample so that a number of samples can be provided in parallel. Where an analog memory, such as a charge storage device, is used, a shifting scheme is conventionally employed to simplify addressing. Where digital conversion and storage is used, a barrel shifter, or random access memory is conventionally employed with more complex addressing circuitry.

The serial to parallel circuit architecture described above is costly to implement as an integrated circuit. That architecture requires considerable surface area on the integrated circuit substrate, is adversely complex so that reliability and manufacturing yields cannot be further improved, suffers from considerable power consumption, and generates an adverse amount of heat.

In view of the problems described above and related problems that consequently become apparent to those skilled in the applicable arts, the need remains in serial to parallel conversion circuits and in systems for sampling composite signals for a serial to parallel conversion circuit especially for use on an integrated circuit substrate.

SUMMARY OF THE INVENTION

Accordingly, a serial to parallel conversion circuit in one embodiment of the present invention provides a plurality of output signals in parallel in response to an input signal that conveys data in serial, for example in the form of analog amplitudes, and a synchronizing signal. The conversion circuit includes a phase locked loop and a plurality of memory devices. The phase locked loop includes an oscillator, a shift circuit, and a comparator. The oscillator provides a clock signal at a period responsive to an error signal. The shift circuit shifts in response to the clock signal, and provides a pointer signal and an overflow signal. The comparator provides the error signal by comparing in response to the input signal and the overflow signal. The pointer signal identifies a memory device of the plurality for writing in response to the data. The memory devices thereby provide the plurality of output signals.

According to a first aspect of such an embodiment, the shift circuit serves two functions: to lock the loop on an integer multiple of the synchronizing signal and to identify the memory device for writing. By serving two functions, several benefits inure including: over all circuit complexity is reduced, less surface area on the integrated circuit substrate is used for the serial to parallel conversion function, reliability and manufacturing yields are improved, and power and heat consumption are reduced.

According to another aspect, the shift circuit shifts a walking pattern to assert the pointer signal. In one embodiment, the pointer signal is conveyed on a plurality of lines connecting the shift circuit and the memory devices. By shifting a walking-one pattern, only one line of the plurality is active, thus identifying a memory device without additional addressing circuitry such as a counter.

According to an another aspect, the shift circuit includes a detector responsive to the pointer signal. The detector establishes and maintains the walking pattern. These functions constitute self-initialization. By self-initializing, the need for conventional power-on and power-fail detection circuitry is eliminated and start up problems associated with such circuitry are avoided.

According to yet another aspect, the shift circuit includes a plurality of stages characterized by minimal DC current consumption in one of two logic states. In operation, such a stage reduces power dissipation during shifting. By arranging the walking pattern with all but one stage in the state having minimal DC current consumption, overall power dissipation is reduced.

According to still another aspect, a shift stage of the present invention operates from a two phase clock so that generation of a clock at the sampling rate is not necessary. By operating from two half-frequency clocks, circuits of the present invention generate less noise, consume less power, and are less subject to variation in circuit structure and performance attributable to integrated circuit fabrication process variation.

The present invention may be practiced according to a method for providing a plurality of output signals in parallel, each respective output signal of the plurality responsive to a respective input signal value occurring during a first period. The method includes the steps of (1) determining the beginning of the first period and (2) maintaining the plurality of output signals in parallel. To determine the beginning of the first period, a variable frequency oscillator in cooperation with a phase comparator determines a second period by comparing the phase of a first signal, characterized by an integer multiple of the second period, with a second signal, characterized by the first period. An output of the oscillator is coupled to a shift circuit comprising shift bit positions at least equal in number to the integer. And, the shift circuit provides, for each shift bit position, a respective identifying signal. The plurality of output signals is maintained in parallel by, for each respective output signal, setting a respective memory device identified by the respective identifying signal, wherein setting is in response to sampling the respective input signal value.

According to a first aspect of such a method, by generating the identifying signal using the same shift circuit that is used to control the oscillator, synchronization between the input signal and the plurality of output signals is reliably maintained.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the articles, devices, methods, and combinations particularly pointed out in the appended claims.

DESCRIPTION OF THE DRAWINGS

FIG. 6 is a timing diagram of the operation of a shift stage of shift circuit 42 shown in FIG. 2.

A person having ordinary skill in the art will recognize where portions of a diagram have been expanded to improve the clarity of the presentation.

In each functional block diagram, a single line between functional blocks represents one or more signals. Signals that appear on several figures and have the same mnemonic are coupled together by direct connection or by additional devices. A signal named with a mnemonic and a second signal named with the same mnemonic followed by an asterisk are related by logic inversion.

In each timing diagram the vertical axis represents analog voltage or binary logic levels and the horizontal axis represents time. The vertical axis is intended to show the transition from active (asserted) to passive (non-asserted) levels of each logic signal. The voltages corresponding to the logic levels of the various signals are not necessarily identical among the various signals.

DETAILED DESCRIPTION OF THE INVENTION

Figure 1:
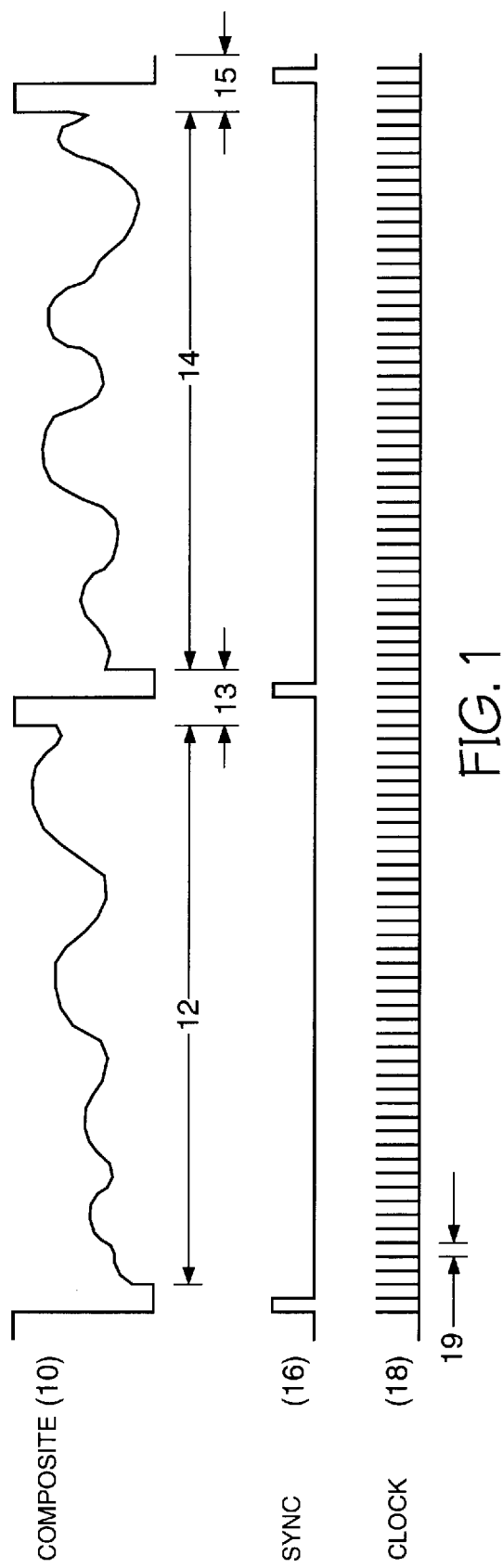
FIG. 1 is a timing diagram of composite signal 10 for conversion by circuits and methods of the present invention.

FIG. 1 is a timing diagram of a composite signal for conversion by circuits and methods of the present invention. COMPOSITE signal 10 includes a series of analog voltages representing varying data during a recurring period 12, 14. A synchronizing signal during periods 13, 15 recurs between each successive update of varying data. Because the synchronizing signal recurs once for every series of analog voltages, and the bandwidth of the analog voltages is limited, a frequency of the synchronizing signal can be determined by circuits receiving COMPOSITE signal 10. The number of analog voltages between successive recurrences of the sync signal is predetermined by systems design as an integer, for example 1000. The 1000 data values in period 12, also referred to as 1000 channels, in one embodiment are updated by 1000 new data values in period 14. In another embodiment, data values in period 14 are unrelated to values in period 12 so that several thousand data values are communicated with a synchronizing signal.

By circuits and methods of the present invention discussed below, the plurality of analog amplitudes during periods 12, 14 are provided in parallel so that the value as last received for each channel is continuously maintained.

The remaining signals shown in FIG. 1 are discussed below in the context of circuits of the present invention that operate with reference to such signals.

Figure 2:
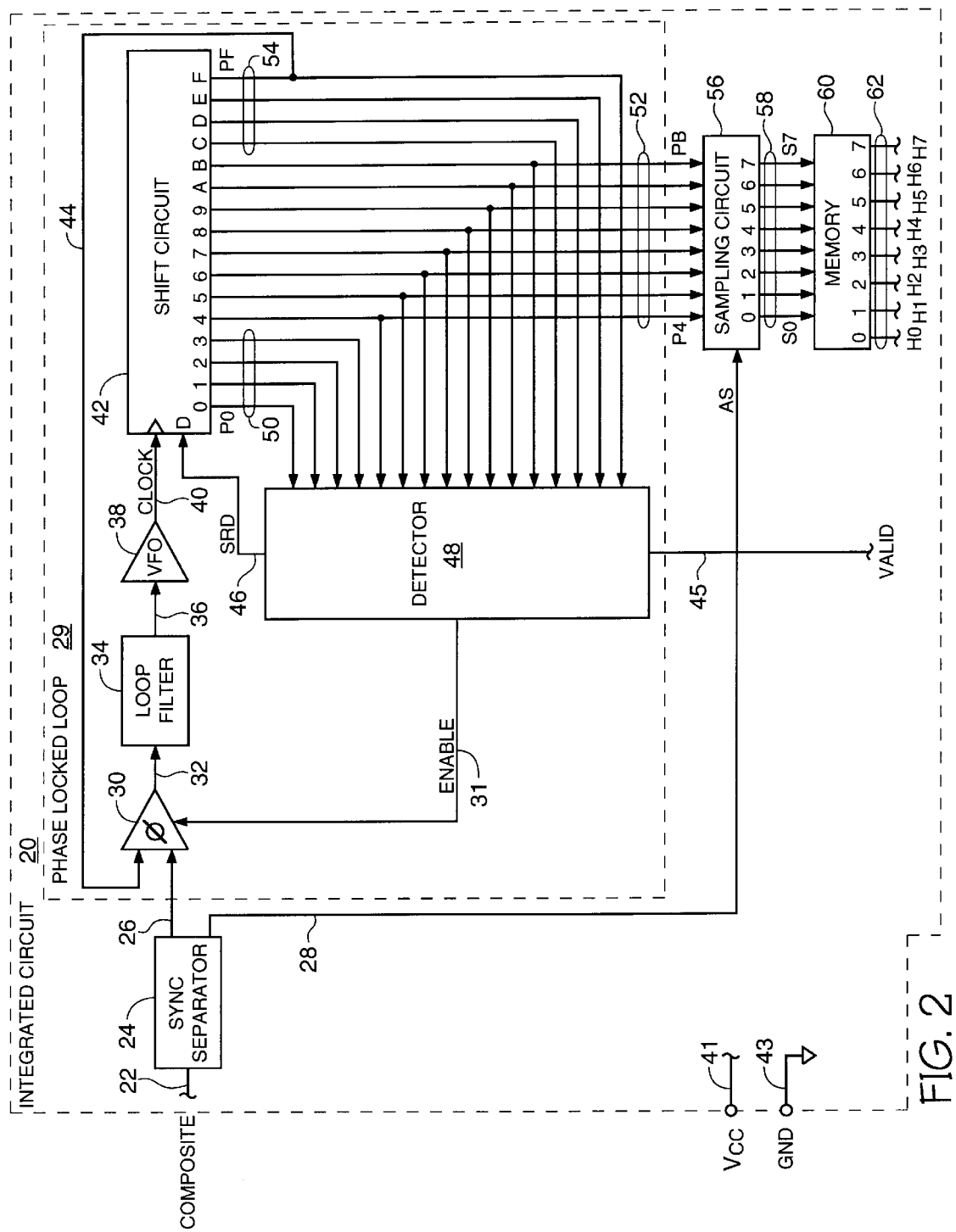
FIG. 2 is a functional block diagram of an integrated circuit embodiment of the present invention.

FIG. 2 is a functional block diagram of an integrated circuit embodiment of the present invention. COMPOSITE signal 10 on line 22 is converted to parallel outputs H0 through H7 on lines 62 by integrated circuit 20. COMPOSITE signal 10 includes a synchronizing signal during periods 13, 15 shown in FIG. 1 as a maximum amplitude followed by a minimum amplitude with a bandwidth greater than the bandwidth of the composite signal during periods 12, 14. Sync separator circuit 24 detects this out-of-band signal and provides SYNC signal 16 on line 26. Conventional techniques are used in sync separator circuit 24 to detect and separate signals, such as edge detection, threshold detection, switching, filtering, and delay techniques.

The signal on line 28 in one embodiment includes COMPOSITE signal 10. In a second embodiment, the signal on line 28 is a blanked version of signal 10 so that the waveform during periods 13, 15 does not adversely affect other circuits of integrated circuit 20. Blanking is accomplished with conventional methods and circuits known in the art.

An integrated circuit in an alternate embodiment of the present invention does not include on-chip sync separation. In operation, lines 26 and 28 are coupled by two or more conductors to an external sync separator for receiving a sync signal and for receiving a signal separated from the synchronization signal.

Integrated circuit 20 includes phase locked loop 29 including phase detector 30, loop filter 34, variable frequency oscillator (VFO) 38, and shift circuit 42. Signal CLOCK 18, as shown in FIG. 1, appears on line 40 at the output of VFO 38. Shift circuit 42 provides a delay so that phase locked loop 29 locks on a period of the synchronizing frequency shown in FIG. 1 as period 12 plus period 13 while VFO 38 operates at a shorter period 19 as shown in FIG. 1. Phase detector 30, loop filter 34, and VFO 38 employ conventional circuits known in the art. For example, a conventional voltage controlled oscillator (VCO) is used in an alternate and equivalent embodiment of VFO 38.

In operation, phase comparator 30 responds to a difference in the phase of signals on lines 26 and 44 by outputting an error signal on line 32 at least in part proportional to the extent of the phase difference. Loop filter 34 in a preferred embodiment includes a low-pass filter for removing high frequency components from the error signal, to provide a band-limited frequency control signal on line 36. VFO 38 responds to the frequency control signal by adjusting its operating oscillator frequency and, hence, the period 19 of signal CLOCK 18 on line 40. By filtering the error signal, loop filter 34 prevents erratic frequency changes by VFO 38.

Shift circuit 42 shifts a pattern of high and low states in response to signal CLOCK 18 and provides pointer signals P0 through PF. Shift circuit 42 includes 16 shift stages. In alternate embodiments, fewer or more stages are used to provide a delay consistent with the duration between recurring periods 13, 15 and the number of analog amplitudes to be sampled as serial data during period 12.

On initial or subsequent receipt of operating power on lines 41 and 43, the collective state of these shift stages will included a random population in the "high" state and the remainder in the "low" state. These stages are connected in series from a first shift bit position coupled to output P0 to a last shift bit position coupled to output PF so that, for every period of signal CLOCK 18 on line 40, the pattern of high and low states shifts to the right one shift bit position. Signal PF, provided at the last shift bit position, constitutes an overflow signal from shift circuit 42 and indicates, when "high" that a walking-one pattern has been shifted 15 times from the time the pattern was established.

Shift circuit 42 provides pointer signals P0 through PF on three groups of lines 50, 52, and 54. Pointer signals on lines in group 52 are connected to sampling circuit 56 for controlling sampling and for directing access to memory 60. Signals in groups 50 and 54 are connected to detector 48 for maintaining the walking-one pattern. By reserving a number of pointer lines at the beginning and at the end of period 12 shown on FIG. 1, accuracy of sampling is improved because sampling circuit 56 has time to settle or otherwise prepare for receipt of analog signals during period 12. In an alternate embodiment of integrated circuit 20, COMPOSITE signal 10 includes one or more additional periods during which serial to parallel conversion by integrated circuit 20 is not required. The length of such additional periods can be compensated for by selecting an appropriate number of lines for groups 50 and 54 as will be apparent to one of ordinary skill.

The pointer signal coupled from shift circuit 42 to sampling circuit 56 in the illustrated embodiment includes signals on 8 lines for identifying 8 samples per period 12. Also, signal group 52 is preceded and followed by shift bit positions not coupled to sampling circuit 56. In alternate and equivalent embodiments the number and time occurrence of signals to be sampled during period 12 varies with system design and the pointer signal is conveyed on one or more lines with one or more logic levels being associated with each pointer value. Also, the number of preceding and following shift bit positions (if any) that are not coupled to a sampling circuit is, in alternate embodiments, any number including zero.

For example, in another embodiment, 1000 samples immediately follow the sync signal period and an additional period having a duration equivalent to 3000 samples stands between the last sample and the next occurrence of the synchronizing signal. A shift circuit in such an embodiment includes 1000 shift stages and provides pointer signals P0 through P999 coupled to a sampling circuit in a manner similar to that shown in FIG. 2. In place of 3000 additional shift stages, a counter, started by the overflow signal P999, counts the remaining 3000 periods of the clock signal until the next sync signal is expected to occur. In such an embodiment, a conventional counter circuit is used to generate a carry signal used by detector circuitry, as would be appreciated by one of ordinary skill in the art in view of the detector functions described below.

In the embodiment shown in FIG. 2, detector 48 establishes and maintains a walking-one pattern in shift circuit 42, provides an ENABLE signal on line 31 and provides a VALID signal on line 45 using conventional logic circuitry. For establishing and maintaining a walking-one pattern, in one embodiment, detector 48 includes a 16 input NOR gate for providing an output "low" on signal SRD on line 46 when any input pointer signal P0 through PF is "high." Only when all pointer signals are "low" will the gate provide a "high" signal SRD on line 46. In operation, "low" signals are clocked into shift circuit 42 and shifted toward shift bit position PF until all shift stages of shift circuit 42 are "low." Then, one "high" signal is shifted into the first shift bit position; after which the walking-one pattern has been established and will be so maintained.

Detector 48 provides an ENABLE signal on line 31 so that phase comparator 30 is enabled for phase detection only when signal ENABLE is asserted. By not asserting signal ENABLE, the locked condition of phase locked loop 29 is easier to maintain. Phase comparator 30, when not enabled for phase comparison, maintains the error signal using one or more memory devices during times when signal ENABLE is not asserted.

To convert the COMPOSITE signal 10 shown in FIG. 1, a simpler variation of the circuit shown in FIG. 2 can be employed. As shown COMPOSITE signal 10 does not include additional periods during which serial to parallel conversion by integrated circuit 20 is required. For serial to parallel conversion of COMPOSITE signal 10, a phase comparator that remains continuously enabled for comparison is employed in place of phase comparator 30 shown in FIG. 2. Likewise, a detector that does not generate an ENABLE signal is employed in place of detector 48.

In the embodiment shown in FIG. 2, detector 48 also provides signal VALID on line 45. Parallel output values of signals H0 through H7 are considered valid when a walking-one pattern has been established and maintained for the maximum number of shifts of shift circuit 42.

Sampling circuit 56 samples analog signal AS on line 28 and provides signals 58 to memory 60. Operation of each of two different embodiments of sampling circuit 56 is discussed below with reference to FIGS. 3 and 4. In each embodiment, when one pointer signal, for example P4, is asserted, a measurement of the amplitude of signal AS is provided as sample signal S0.

Memory 60 includes 8 addressable storage locations corresponding to pointer signals P4 through PB, respectively, into which samples of analog signal AS on line 28 are stored as conveyed by signals S0 through S7 on lines 58. For each address, memory 60 includes a memory device of the type appropriate to the signal to be stored. For example, when sample signal S0 is an analog amplitude, the memory device associated with output signal H0 is a conventional analog memory, such as a charge coupled device, a capacitance, or the like. Alternately, when sample signal S0 is a digital signal, the memory device is a conventional digital memory circuit such as a flip flop, a register, a dynamic memory cell, a magnetic bubble, or the like. In an alternate and equivalent embodiment where signal S0 is, for example, a 3-bit digital signal, 3 memory devices in parallel are used for each address in memory 60.

Memory 60 provides 8 output signals H0 through H7 on lines 62, one corresponding to each addressable storage location. These 8 output signals appear in parallel, accomplishing the serial to parallel conversion function of integrated circuit 20.

Figure 3:
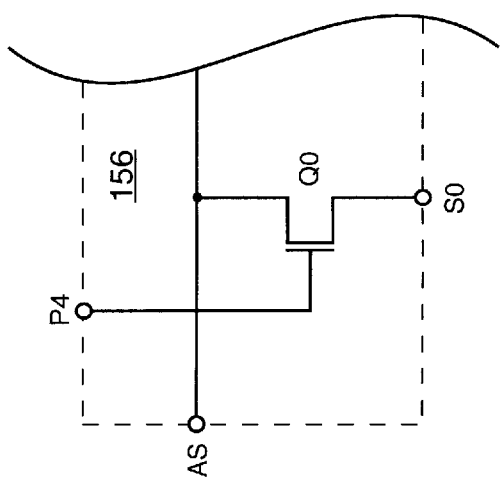
FIG. 3 is a schematic diagram of a portion of the sampling circuit shown in FIG. 2.

FIG. 3 is a schematic diagram of a portion of the sampling circuit shown in FIG. 2. In an embodiment wherein memory 60 stores analog samples, sampling circuit 156 performs the functions of sampling circuit 56 as already described. Transistor Q0 is a MOS field effect transistor that operates as a gate, conducting analog signal AS to be conveyed to memory 60 by signal S0 when pointer signal P4 is asserted "high."

In an alternate and equivalent embodiment, signal AS is coupled to the gate of transistor Q0 and pointer signal P4 is coupled to the channel. This alternate embodiment matches P4 and AS signal drive capabilities and the signal S0 response time to alternate system performance criteria.

Figure 4:
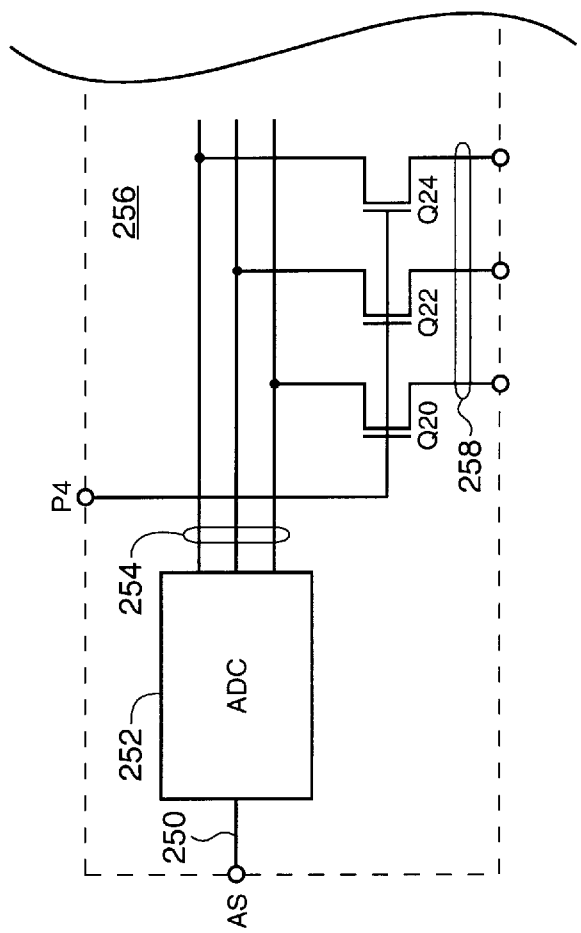
FIG. 4 is a schematic diagram of an alternate sampling circuit of the present invention.

FIG. 4 is a schematic diagram of a portion of an alternate sampling circuit of the present invention wherein memory 60 stores digital samples. Sampling circuit 256 performs the functions of sampling circuit 56 as already described. Analog to digital converter (ADC) 252 in one embodiment includes a conventional flash ADC circuit that provides a 3-bit binary value on lines 254 proportional to the amplitude of signal AS. Each transistor Q20 through Q24 is a MOS field effect transistor that operates as a gate, conducting a signal on a respective line 254 to be conveyed to memory 60 on a respective line 258 when pointer signal P4 is asserted "high." In the embodiment shown in FIG. 4, signal S0 conveys a 3-bit binary value for each sample and memory 60 includes 3 digital memory devices per position.

Figure 5:
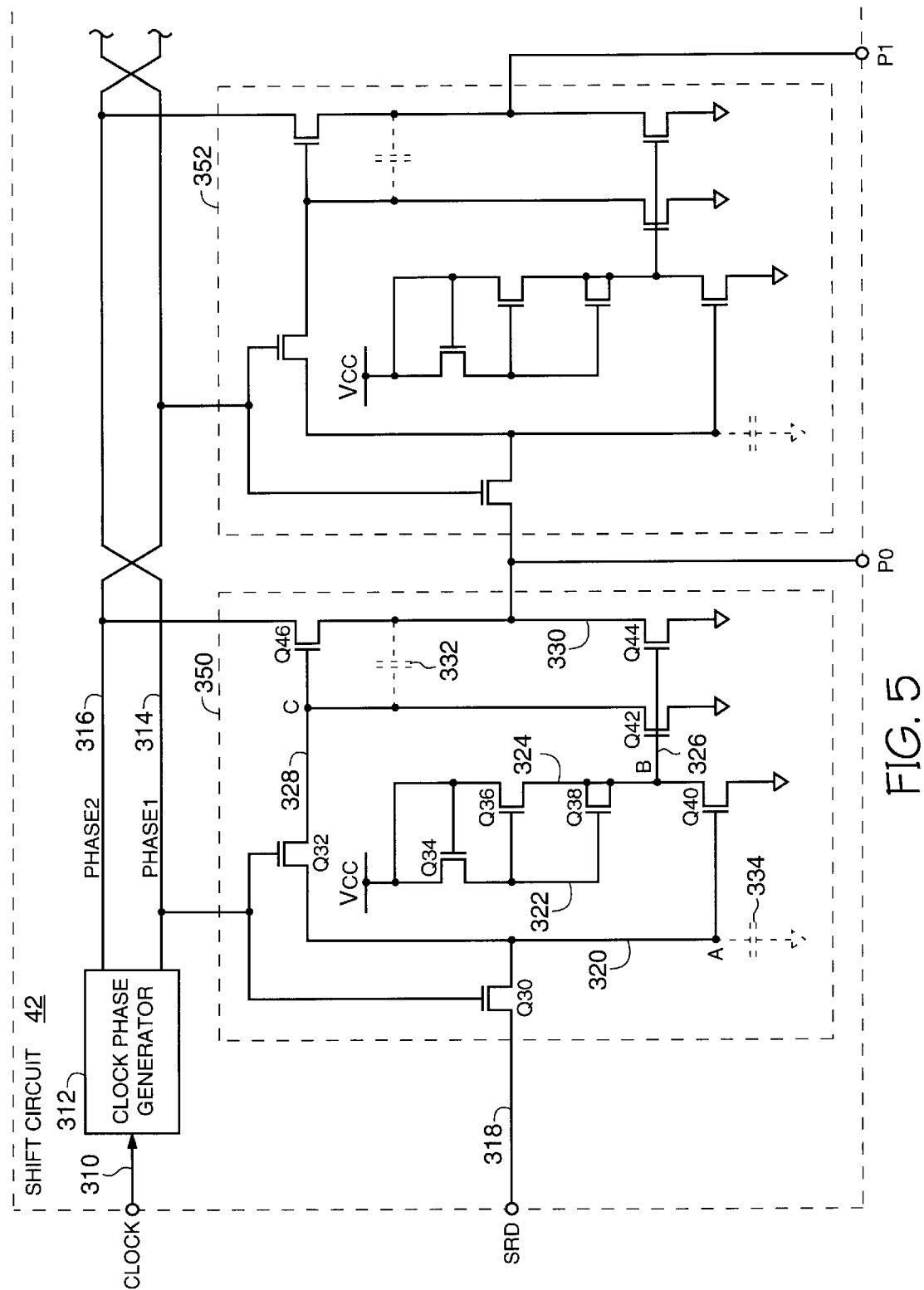
FIG. 5 is a schematic diagram of a portion of the shift circuit shown in FIG. 2.

Before discussing FIG. 5, it is worth noting that in an alternate and equivalent embodiment, shift circuit 42 shown in FIG. 2 is constructed of conventional bi-stable flip flop circuits. Such circuits are static in that the pattern is maintained when shifting is postponed indefinitely. Similarly in another alternate embodiment, some power savings and substrate surface savings result from using conventional dynamic shift register stage circuitry for shift circuit 42. In a preferred embodiment, considerable savings in both power dissipation and substrate surface area are realized using a plurality of dynamic shift circuit stages for shift circuit 42, each stage as shown in FIG. 5.

FIG. 5 is a schematic diagram of a portion of shift circuit 42 shown in FIG. 2. In the portion shown, clock phase generator 312 cooperates with all shift stages of which shift stages 350 and 352 are representative. Transistors Q30 through Q46 form shift stage 350 at the first shift bit position and generate pointer signal P0 on line 330. Based on signal CLOCK 18 on line 310, clock phase generator 312 generates two non-overlapping clock phase signals, PHASE1 and PHASE2, on lines 314 and 316 using conventional timing and logic circuits. Because shift circuit 42 shifts on every edge of CLOCK signal 18, the need for a signal of twice the frequency of signal CLOCK signal 18 is eliminated. Operation of shift stage 350 is best understood with reference to a timing diagram. All stages in shift circuit 42, in the preferred embodiment, are identical to shift stage 350, shown in FIG. 5.

FIG. 6 is a timing diagram of the operation of shift stage 350 of shift circuit 42 shown in FIG. 2. In summary, from time T1 to time T3 stage 350 toggles from "low" to "high" in response to a "high" signal SRD on line 318. Consequently, stage 350 asserts identifying signal P0 on line 330 "high." From time T3 to time T5, a "low" on signal SRD on line 318 toggles stage 350 so that identifying signal 330 is not asserted.

Assuming for the sake of description that stage 350 was providing a "low" on identifying signal P0 prior to time T1, at time T1 the rising edge of signal CLOCK 18 on line 310 causes transistors Q30 and Q32 to conduct, signal A on line 320 to go "high," transistor Q40 to conduct, transistor Q42 to stop conducting, and signal C on line 328 to go "high." After a delay prescribed by clock phase generator 312, signal PHASE1 goes "low" isolating stage 350 from further changes or noise on line 318. Then, in response to the falling edge of signal CLOCK 18, signal PHASE2 on line 316 goes "high," transistor Q46, in cooperation with an intrinsic capacitance between lines 328 and 330, "boots" and provides signal P0 on line 330 at or near the $V_{CC}$ power supply potential.

Stage 350 is coupled to the next stage 352 by data line 320 and clock lines 314 and 316. By reversing lines 314 and 316 into next stage 352, operations in stage 350 just after time T1 are performed in next stage 352 just after time T3. Therefore, when signal PHASE2 on line 316 goes "low" so that transistor Q46 no longer supplies current to line 330, there is no adverse effect in next stage 352, since next stage 352 has already seized data from line 330 and will soon enter the isolated state.

Stage 350 draws minimal current when identifying signal P0 is "low" and little additional current when a "low" bit is shifted through stage 350. Stage 350 draws a nominal current through transistors Q34 through Q38 when signal A on line 320 is "high." However, since shift circuit 42 in cooperation with logic circuit 48 shifts a walking-one pattern, identifying signal P0 is predominantly "low" resulting in remarkably low power dissipation in shift circuit 42.

In a preferred embodiment of the circuit shown in FIG. 5, transistor Q42 is designed to provide weak drive capability. This capability is realized by conventional techniques including making the channel of Q42 for example four times longer than the nominal channel length used for the remaining transistors shown on FIG. 5. Other performance advantages are realized by (1) arranging transistors Q36 and Q38 to provide significant capacitance for "booting" transistor Q42, (2) arranging parasitic capacitances at line 320 to ground and between lines 328 and 330 for improved switching operation, and (3) arranging a favorable capacitive divider at node C. The latter is accomplished in a preferred embodiment by making transistor Q46 about 3 times larger than transistor Q32 and by using conventional layout techniques to assure that the capacitance between lines 314 and 328 is about ten times smaller than all other capacitance on node C.

The foregoing description discusses preferred embodiments of the present invention, which may be changed or modified without departing from the scope of the present invention.

For example, P-channel FETs may be replaced with N-channel FETs (and vice versa) in some applications with appropriate polarity changes in controlling signals as required. Moreover, the P-channel and N-channel FETs discussed above generally represent active devices which may be replaced with bipolar or other technology active devices.

Still further, those skilled in the art will understand that the logical elements described above may be formed using a wide variety of logical gates employing any polarity of input or output signals and that the logical values described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. An "integrated circuit" refers generally to circuits produced using photolithography and includes but is not limited to a packaged integrated circuit, a portion of a packaged integrated circuit, an unpackaged integrated circuit, a combination on a substrate of packaged or unpackaged integrated circuits or both, a microprocessor, a microcontroller, a memory, combinations thereof, and equivalents.

A "memory device" refers generally to a static random access memory, a dynamic random access memory, a register, a flip-flop, a charge-coupled device, combinations thereof, and equivalents.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period.

When a physical property of a signal has a quantitative measure and the property is used by design to control or communicate information, then the signal is said to be characterized by having a "value." The amplitude may be instantaneous or an average. For a binary (digital) signal, the two characteristic values are equivalently called logic states and logic levels "high" and "low."

What is claimed is:

1. A shift register circuit, comprising:

a clock circuit providing first and second clock pulse signals having mutually non-overlapping pulses and the same pulse frequency; and a plurality of shift register stages, each stage having an input and an output, wherein the output of each stage other than the last stage is connected to the input of the next succeeding stage, each of the stages is characterized as either an even stage or an odd stage, the even stages alternating with the odd stages so that, except for the last stage, the output of each even stage connects to the input of the succeeding odd stage and the output of each odd stage connects to the input of the succeeding even stage, each even stage has first and second clock inputs respectively connected to receive the first and second clock pulse signals, and each odd stage has first and second clock inputs respectively connected to receive the second and first clock pulse signals;

wherein each shift register stage includes a first output transistor having a gate and a channel, the channel of the first output transistor being connected between the second clock input of the stage and the output of the stage, a second output transistor having a gate and a channel, the channel of the second output transistor being connected between the output of the stage and an electrical ground, an inverter transistor having a gate, a source, and a drain, the drain of the inverter transistor being connected to the gate of the second output transistor, and source of the inverter transistor being connected to the electrical ground, a current source connected to the drain of the inverter transistor, and a first input transistor having a gate, a source, and a drain, the gate of the first input transistor being connected to the first clock input of the stage, the source of the first input transistor being connected to the input of the stage, and the drain of the first input transistor being connected to both the gate of the inverter transistor and the gate of the first output transistor.

2. A shift register according to claim 1, wherein each shift register stage further comprises:

a pull-down transistor having a gate and a channel, the gate of the pull-down transistor being connected to the gate of the second output transistor, and the channel of the pull-down transistor being connected between the electrical ground and the gate of the first output transistor.

3. A shift register according to claim 2, wherein each shift register stage further comprises:

a second input transistor having a gate and a channel, the gate of the second input transistor being connected to the first clock input of the stage, and the channel of the second input transistor being connected between the drain of the first input transistor and the gate of the first output transistor;

whereby the channel of the second input transistor connects the drain of the first input transistor to the gate of the first output transistor in response to clock pulses received at the first clock input of the stage.

4. A shift register according to claim 1, wherein each shift register stage further comprises:

a capacitance connected between the gate of the first output transistor and the output of the stage.

5. A shift register according to claim 1, wherein each shift register stage further comprises:

a capacitance connected between the gate of the inverter transistor and the electrical ground.

6. A phase locked loop circuit for receiving a periodic sync signal and for producing a clock signal whose frequency is a multiple of the frequency of the sync signal, comprising:

a phase comparator circuit having first and second inputs and an output, the first input being connected to receive the sync signal;

a low pass filter having an input and an output, the input of the low pass filter being connected to the output of the phase comparator;

a variable frequency oscillator circuit having an input and an output, the input of the oscillator being connected to the output of the low pass filter, and the output of the oscillator providing said clock signal; and a shift register circuit having a plurality of shift register stages, having a clock input connected to receive said clock signal, and having an overflow output connected to the second input of the phase comparator.

7. A phase locked loop according to claim 6, wherein the last of the shift register stages outputs said overflow output.

8. A phase locked loop according to claim 6, wherein the shift register circuit produces a walking one pattern in the shift register stages in response to the clock signal.

9. A phase locked loop according to claim 6, wherein the shift register circuit is configured so that no more than one stage at a time outputs a logical one, and so that said logical one output value shifts progressively through the stages of the shift register in response to the clock signal.

10. A phase locked loop according to claim 6, further comprising:

a counter having a clock input, a start input, and an output, the clock input of the counter being connected to the output of the oscillator, the start input of the counter being connected to the overflow output of the shift register, and the output of the counter being connected to the second input of the phase comparator;

wherein the counter starts counting periods of the clock signal provided by the oscillator in response to the start input of the counter receiving an overflow signal from the overflow output of the shift register;

whereby the counter connects the overflow output of the shift register to the second input of the phase comparator.

11. A serial-to-parallel converter circuit for receiving a sync signal and a serial input data signal and converting the serial input data signal to a parallel output data signal, comprising:

a phase comparator circuit having first and second inputs and an output, the first input being connected to receive the sync signal;

a low pass filter having an input and an output, the input of the low pass filter being connected to the output of the phase comparator;

a variable frequency oscillator circuit having an input and an output, the input of the oscillator being connected to the output of the low pass filter;

a multi-stage shift register circuit having a clock input connected to the output of the phase comparator, wherein each of a plurality of the shift register stages provides an output, and wherein one of the shift register stages provides an overflow output connected to the second input of the phase comparator; and a sampling circuit having a data input, a plurality of sampling control inputs, and an equal plurality of data outputs, wherein
the data input is connected to receive the serial input data signal, and
each of the sampling control inputs is connected to the output of a corresponding one of the shift register stages;

whereby said plurality of sampling circuit data outputs collectively produce said parallel output data signal.

12. A serial-to-parallel converter according to claim 11, wherein the shift register circuit produces a walking one pattern in response to the clock signal.

13. A serial-to-parallel converter according to claim 11, wherein the shift register circuit is configured so that no more than one stage at a time outputs a logical one, and so that said logical one output value shifts progressively through the stages of the shift register in response to the clock signal.

14. A serial-to-parallel converter according to claim 11, further comprising:

a detector circuit having an output and a plurality of inputs, wherein the output produces a logical value which is the inversion of the logical OR of said plurality of inputs;

wherein a plurality of the shift register stages each includes an output connected to a corresponding one of said detector inputs; and wherein the shift register further includes a data input connected to the output of the detector circuit.

15. A serial-to-parallel converter according to claim 11, further comprising:

a counter having a clock input, a start input, and an output, the clock input of the counter being connected to the output of the oscillator, the start input of the counter being connected to the overflow output of the shift register, and the output of the counter being connected to the second input of the phase comparator;

wherein the counter starts counting periods of the clock signal provided by the oscillator in response to the start input of the counter receiving an overflow signal from the overflow output of the shift register;

whereby the counter connects the overflow output of the shift register to the second input of the phase comparator.

16. A method of producing a clock signal whose frequency is a multiple of the frequency of a received sync signal, comprising the steps of:

producing a comparator output signal proportional to the phase difference between the received sync signal and an overflow signal;

producing a periodic clock signal having a frequency proportional to the comparator output signal;

shifting a logical one signal along a succession of shift register stages, wherein the logical one signal shifts to a succeeding one of the stages in response to the clock signal; and providing as said overflow signal an output of one of the shift register stages.

17. A method according to claim 16, wherein the step of providing the overflow signal further comprises providing as said overflow signal an output of the last one of the shift register stages.

18. A method according to claim 16, further comprising the step of:

producing a detector signal whose value is the inversion of the logical OR of the logical signals stored in a plurality of the shift register stages; and shifting the detector signal value into the first of the shift register stages.

19. A method according to claim 16, wherein the step of producing a periodic clock signal comprises:

low pass filtering the comparator output signal; and producing the periodic clock signal so as to have a frequency proportional to the low pass filtered comparator output signal.

20. A method according to claim 16, wherein the step of shifting a logical one signal further comprises:

shifting the logical one signal to a succeeding one of the stages in response to each period of the clock signal.

21. A method of producing a walking one pattern in a shift register at a shift rate which is a multiple of the frequency of a received sync signal, comprising the steps of:

providing a shift register having a plurality of stages;

providing as an overflow signal an output of one of the shift register stages;

producing a comparator output signal proportional to the phase difference between the received sync signal and the overflow signal;

low pass filtering the comparator output signal;

producing a periodic clock signal having a frequency proportional to the low pass filtered comparator output signal;

storing a logical one signal in no more than one of the shift register stages at a time;

storing a logical zero signal in the other shift register stages; and shifting the logical one signal along a succession of the shift register stages, wherein the logical one signal shifts to a succeeding one of the stages in response to the clock signal.

22. A method according to claim 21, wherein the step of shifting the logical one signal further comprises:
   shifting the logical one signal to a succeeding one of the stages in response to each period of the clock signal.

23. A circuit for producing a walking one pattern in a shift register at a shift rate which is a multiple of the frequency of a received sync signal, comprising:
   a phase comparator circuit having first and second inputs and an output, the first input being connected to receive the sync signal;
   a low pass filter having an input and an output, the input of the low pass filter being connected to the output of the phase comparator;
   a variable frequency oscillator circuit having an input and an output, the input of the oscillator being connected to the output of the low pass filter, and the output of the oscillator providing said clock signal;
   a shift register circuit having a plurality of shift register stages, having a clock input connected to receive said clock signal, and having an overflow output connected to the second input of the phase comparator, and having a data input; and
   a detector circuit having an output and a plurality of inputs, wherein
      the output of the detector circuit produces a logical value which is the inversion of the logical OR of said plurality of inputs, and
      the output of the detector circuit is connected to the data input of the shift register;
   wherein a plurality of the shift register stages each includes an output connected to a corresponding one of said detector inputs.

24. A phase locked loop circuit for producing a clock signal whose frequency is a multiple of the frequency of a received sync signal, comprising:
   a phase comparator circuit having first and second inputs and an output, the first input being connected to receive the sync signal;
   a variable frequency oscillator circuit having an input and an output, the input of the oscillator being connected to the output of the phase comparator, and the output of the oscillator providing said clock signal; and
   a shift register circuit having a plurality of shift register stages, having a clock input connected to receive said clock signal, and having an overflow output connected to the second input of the phase comparator.

25. A serial-to-parallel converter circuit for receiving a sync signal and a serial input data signal and converting the serial input data signal to a parallel output data signal, comprising:
   a phase comparator circuit having first and second inputs and an output, the first input being connected to receive the sync signal;
   a variable frequency oscillator circuit having an input and an output, the input of the oscillator being connected to the output of the phase comparator;
   a multi-stage shift register circuit having a clock input connected to the output of the phase comparator, wherein each of a plurality of the shift register stages provides an output, and wherein one of the shift register stages provides an overflow output connected to the second input of the phase comparator; and
   a sampling circuit having a data input, a plurality of sampling control inputs, and an equal plurality of data outputs, wherein
      the data input is connected to receive the serial input data signal, and
      each of the sampling control inputs is connected to the output of a corresponding one of the shift register stages;
   whereby said plurality of sampling circuit data outputs collectively produce said parallel output data signal.

26. A method for converting a serial input data signal to a parallel output data signal, comprising the steps of:
   receiving a sync signal and a serial input data signal;
   producing a comparator output signal proportional to the phase difference between the received sync signal and an overflow signal;
   producing a periodic clock signal having a frequency proportional to the comparator output signal;
   providing a shift register having a plurality of shift register stages, each stage having an output;
   shifting a logical one signal along a succession of the shift register stages so that a logical one signal shifts to the output of a succeeding one of the stages in response to the clock signal;
   connecting an output of one of the shift register stages to provide said overflow signal;
   providing a sampling circuit having a data input, a plurality N of sampling control inputs, and an equal plurality N of data outputs;
   connecting the data input of the sampling circuit to receive the serial input data signal;
   connecting each of the sampling control inputs to the output of a corresponding one of the shift register stages;
   providing at the k-th data output of the sampling circuit the value of the serial input data signal at a time when the k-th sampling control input of the sampling circuit is receiving a logical one signal from the shift register, for each integer k from 1 through N; and
   providing said plurality of sampling circuit data outputs as said parallel output data signal.

27. A method according to claim 26, wherein the step of producing a periodic clock signal comprises:
   low pass filtering the comparator output signal; and
   producing the periodic clock signal having a frequency proportional to the low pass filtered comparator output signal.

28. A method according to claim 26, wherein the shifting step further comprises shifting said logical one signal so that no more than one stage at a time outputs a logical one.

29. A method according to claim 26, further comprising the steps of:
   producing a shift register input signal which is the logical inversion of the logical OR of the outputs of a plurality of the shift register stages; and
   connecting the shift register input signal to a data input of a first stage of the shift register.

30. A method according to claim 26, wherein the step of connecting an output of one of the shift register stages to provide said overflow signal further comprises:
   beginning when the output of said one of the shift register stages has a logical one value, counting periods of the clock signal; and
   when the number of counted periods reaches a predetermined number, changing the value of the overflow signal from logical zero to logical one.

31. A method of shifting data through a shift register circuit, comprising the steps of:

providing first and second clock pulse signals having mutually non-overlapping pulses and the same pulse frequency; and providing a plurality of shift register stages, each stage having first and second clock inputs, a data input, and a data output, wherein each of the stages is characterized as either an even stage or an odd stage, the even stages alternating with the odd stages;

connecting the data output of each stage other than the last stage to the data input of the next succeeding stage, so that, except for the data output of the last stage, the data output of each even stage is connected to the data input of the succeeding odd stage, and the data output of each odd stage is connected to the data input of the succeeding even stage;

connecting the respective first and second clock inputs of each even stage to receive the first and second clock pulse signals, respectively;

connecting the respective first and second clock inputs of each odd stage to receive the second and first clock pulse signals, respectively;

providing in each shift register stage an input transistor, first and second output transistors, and an inverter transistor, wherein each transistor includes a gate and includes a channel connected between a drain and a source;

connecting the channel of the first output transistor of each stage between the second clock input of the stage and the output of the stage;

connecting the channel of the second output transistor of each stage between the output of the stage and an electrical ground;

connecting the drain of the inverter transistor of each stage to the gate of the second output transistor, and connecting the source of the inverter transistor of each stage to the electrical ground;

providing a regulated current to the drain of the inverter transistor of each stage;

connecting the gate of the first input transistor of each stage to the first clock input of the stage;

connecting the source of the first input transistor of each stage to the input of the stage;

connecting the drain of the first input transistor of each stage to the gate of the inverter transistor of the stage; and connecting the drain of the first input transistor of each stage to the gate of the first output transistor of the stage.

32. A method according to claim 31, further comprising the steps of:

providing in each shift register stage a pull-down transistor having a gate and a channel;

connecting the gate of the pull-down transistor of each stage to the gate of the second output transistor of the stage; and connecting the channel of the pull-down transistor of each stage between the electrical ground and the gate of the first output transistor of the stage.

33. A method according to claim 32, wherein the step of connecting the drain of the first input transistor of each stage to the gate of the first output transistor of the stage further comprises:

providing in each shift register stage a second input transistor having a gate and a channel;

connecting the gate of the second input transistor of each stage to the first clock input of the stage; and connecting the channel of the second input transistor of each stage between the drain of the first input transistor of the stage and the gate of the first output transistor of the stage.

34. A method according to claim 31, further comprising the step of:

in each shift register stage, connecting a capacitance between the gate of the first output transistor of the stage and the output of the stage.

35. A method according to claim 31, further comprising the step of:

in each shift register stage, connecting a capacitance between the gate of the inverter transistor of the stage and the electrical ground.

* * * * *